(12) United States Patent
Wong et al.

(10) Patent No.: US 8,471,390 B2
(45) Date of Patent: Jun. 25, 2013

(54) POWER MOSFET CONTACT METALLIZATION

(75) Inventors: Ronald Wong, Millbrae, CA (US); Jason Qi, Frisco, TX (US); Kyle Terrill, Santa Clara, CA (US); Kuo-In Chen, Los Altos, CA (US)

(73) Assignee: Vishay-Siliconix, Santa Clara, CA (US)

( * ) Notice: Subject to any disclaimer, the term of this patent is extended or adjusted under 35 U.S.C. 154(b) by 360 days.

(21) Appl. No.: 11/799,889

(22) Filed: May 2, 2007

(65) Prior Publication Data

US 2007/0284754 A1    Dec. 13, 2007

Related U.S. Application Data

(60) Provisional application No. 60/799,868, filed on May 12, 2006.

(51) Int. Cl.
*H01L 23/48* (2006.01)
(52) U.S. Cl.
USPC .......................................................... 257/776
(58) Field of Classification Search
USPC ............................ 257/329, 331, E29.262, 776
See application file for complete search history.

(56) References Cited

U.S. PATENT DOCUMENTS

| 4,642,674 | A | 2/1987 | Schoofs |
| 4,663,644 | A | 5/1987 | Shimizu |
| 4,680,604 | A | 7/1987 | Nakagawa et al. |
| 4,760,431 | A | 7/1988 | Nakagawa et al. |
| 4,774,198 | A | 9/1988 | Contiero et al. |
| 4,775,879 | A | 10/1988 | Robb et al. |
| 4,777,521 | A | 10/1988 | Coe |
| 4,779,123 | A | 10/1988 | Bencuya et al. |
| 4,837,606 | A | 6/1989 | Goodman et al. |
| 4,916,085 | A | 4/1990 | Frisina |
| 5,136,349 | A | 8/1992 | Yilmaz et al. |
| 5,326,711 | A | 7/1994 | Malhi |
| 5,473,176 | A | 12/1995 | Kakumoto |
| 5,539,255 | A | 7/1996 | Cronin |
| 5,648,283 | A | 7/1997 | Tsang et al. |
| 5,742,076 | A | 4/1998 | Sridevan et al. |
| 5,760,440 | A | 6/1998 | Kitamura et al. |
| 5,770,514 | A | 6/1998 | Matsuda et al. |
| 5,866,931 | A | 2/1999 | Bulucea et al. |
| 5,869,357 | A | 2/1999 | Zambrano |
| 5,899,738 | A * | 5/1999 | Wu et al. ....................... 438/618 |

(Continued)

FOREIGN PATENT DOCUMENTS

DE    10239310    3/2004
EP    0133642    3/1985

(Continued)

OTHER PUBLICATIONS

H. Yilmaz et al., Insulated gate Transistor Modeling and Optimizatio, 1984, pp. 274-277 IEDM.

(Continued)

*Primary Examiner* — Bradley K Smith

(57) ABSTRACT

A structure includes a semiconductor device formed in a substrate; an insulator adjacent to the semiconductor device; an electrical contact electrically coupled to the semiconductor device, wherein the electrical contact includes tungsten; and an electrical connector coupled to the electrical contact, wherein the electrical connector includes aluminum. A surface of the insulator and a surface of the electrical contact form a substantially even surface.

11 Claims, 5 Drawing Sheets

U.S. PATENT DOCUMENTS

| | | | |
|---|---|---|---|
| 5,929,481 A | 7/1999 | Hshieh et al. | |
| 5,998,833 A | 12/1999 | Baliga | |
| 6,016,008 A * | 1/2000 | Feldner | 257/751 |
| 6,049,108 A | 4/2000 | Williams et al. | |
| 6,057,558 A | 5/2000 | Yamamoto et al. | |
| 6,133,587 A | 10/2000 | Takeuchi et al. | |
| 6,184,120 B1 | 2/2001 | Tsuchiya | |
| 6,211,018 B1 | 4/2001 | Nam et al. | |
| 6,246,090 B1 | 6/2001 | Brush et al. | |
| 6,319,777 B1 | 11/2001 | Hueting et al. | |
| 6,326,270 B1 | 12/2001 | Lee et al. | |
| 6,329,282 B1 | 12/2001 | Hsu et al. | |
| 6,346,438 B1 | 2/2002 | Yagishita et al. | |
| 6,407,435 B1 | 6/2002 | Ma et al. | |
| 6,413,822 B2 | 7/2002 | Williams et al. | |
| 6,436,827 B1 | 8/2002 | Yamazaki | |
| 6,476,456 B1 * | 11/2002 | Boden, Jr. | 257/486 |
| 6,511,885 B2 | 1/2003 | Harada et al. | |
| 6,528,848 B1 | 3/2003 | Hoshino et al. | |
| 6,566,718 B2 * | 5/2003 | Wieczorek et al. | 257/368 |
| 6,627,950 B1 | 9/2003 | Bulucea et al. | |
| 6,649,975 B2 | 11/2003 | Baliga | |
| 6,737,704 B1 | 5/2004 | Takemori et al. | |
| 6,764,889 B2 | 7/2004 | Baliga | |
| 6,797,588 B2 | 9/2004 | Ishikawa et al. | |
| 6,838,730 B1 | 1/2005 | Kawaguchi et al. | |
| 6,872,668 B1 | 3/2005 | Cao et al. | |
| 6,888,196 B2 | 5/2005 | Kobayashi | |
| 6,891,223 B2 | 5/2005 | Krumrey et al. | |
| 6,906,380 B1 | 6/2005 | Pattanayak et al. | |
| 6,919,248 B2 | 7/2005 | Francis et al. | |
| 6,974,750 B2 | 12/2005 | Haase | |
| 7,008,871 B2 * | 3/2006 | Andricacos et al. | 438/652 |
| 7,186,609 B2 | 3/2007 | Korec et al. | |
| 7,279,743 B2 | 10/2007 | Pattanayak et al. | |
| 7,344,945 B1 | 3/2008 | Pattanayak et al. | |
| 7,361,558 B2 | 4/2008 | Pattanayak et al. | |
| 7,833,863 B1 | 11/2010 | Pattanayak et al. | |
| 8,183,629 B2 | 5/2012 | Pattanayak et al. | |
| 2001/0003367 A1 | 6/2001 | Hshieh et al. | |
| 2001/0023959 A1 | 9/2001 | Harada et al. | |
| 2002/0019099 A1 | 2/2002 | Williams et al. | |
| 2002/0076924 A1 * | 6/2002 | Koo | 438/665 |
| 2002/0125528 A1 | 9/2002 | Kawaguchi et al. | |
| 2003/0001203 A1 | 1/2003 | Ono et al. | |
| 2003/0006456 A1 | 1/2003 | Takahashi et al. | |
| 2003/0008460 A1 | 1/2003 | Darwish | |
| 2003/0062570 A1 | 4/2003 | Darwish et al. | |
| 2003/0137054 A1 | 7/2003 | Ishihara | |
| 2003/0178673 A1 | 9/2003 | Bhalla et al. | |
| 2004/0005783 A1 | 1/2004 | Lee | |
| 2004/0195618 A1 | 10/2004 | Saito et al. | |
| 2005/0158990 A1 | 7/2005 | Park et al. | |
| 2005/0167748 A1 | 8/2005 | Onda et al. | |
| 2005/0199918 A1 | 9/2005 | Calafut et al. | |
| 2005/0287744 A1 | 12/2005 | Ono et al. | |
| 2006/0273390 A1 | 12/2006 | Hshieh et al. | |
| 2007/0114599 A1 * | 5/2007 | Hshieh | 257/330 |
| 2007/0243671 A1 * | 10/2007 | Liaw | 438/151 |
| 2009/0079002 A1 | 3/2009 | Lee et al. | |

FOREIGN PATENT DOCUMENTS

| | | |
|---|---|---|
| EP | 1170803 | 9/2001 |
| JP | 57206073 | 12/1982 |
| JP | 62039069 | 2/1987 |
| JP | 63252480 | 4/1987 |
| JP | 64769 | 8/1988 |
| JP | 7153841 | 6/1995 |
| JP | 8017925 | 1/1996 |
| JP | 2003289075 | 10/2003 |
| JP | 2003318396 | 11/2003 |
| JP | 2005243664 | 9/2005 |
| JP | 2006012967 | 1/2006 |

OTHER PUBLICATIONS

H. Yilmaz, Cell Geometry Effect on IGT Latch-Up, IEEE Electron Device Letters, vol. EDL-6, No. 8, Aug. 1985.

Victor A.K. Temple, MOS-Controlled Thyristors—A New Class of Power Devices, Oct. 1986. pp. 1609-1618, IEEE, vol. ED-33, No. 10.

* cited by examiner

POWER MOSFET CONTACT METALLIZATION

RELATED U.S. APPLICATION

This application claims priority to the copending provisional patent application, Ser. No. 60/799,868, entitled "Power MOSFET Contact Metallization," with filing date May 12, 2006, assigned to the assignee of the present application, and hereby incorporated by reference in its entirety.

FIELD OF THE INVENTION

Embodiments in accordance with the present invention generally pertain to semiconductor devices, in particular power metal oxide semiconductor field effect transistors (power MOSFETs).

BACKGROUND

Photolithography is commonly used to fabricate semiconductor devices. In photolithography, a pattern from a mask is transferred to a surface. Light is directed through the mask and focused on the surface. As features of semiconductor devices get smaller and smaller, better focus becomes more important.

SUMMARY

A method and/or system that facilitate the use of photolithography to fabricate semiconductor devices with small features would be advantageous. Embodiments in accordance with the present invention provide this and other advantages.

In one embodiment, a structure includes a semiconductor device formed in a substrate; an insulator adjacent to the semiconductor device; an electrical contact electrically coupled to the semiconductor device, wherein the electrical contact includes tungsten; and an electrical connector coupled to the electrical contact, wherein the electrical connector includes aluminum.

In one embodiment, a surface of the insulator and a surface of the electrical contact form a substantially even surface. The substantially even surface improves focus during photolithography, so that smaller sized features can be formed on the surface.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes (e.g., process 200 of FIG. 2) of semiconductor device fabrication.

It is understood that the figures are not drawn to scale, and only portions of the structures depicted, as well as the various layers that form those structures, are shown. For simplicity of discussion and illustration, the process is described for one or two transistors, although in actuality more than one or two transistors may be formed.

Furthermore, it is appreciated that other fabrication processes and steps may be performed along with the processes and steps discussed herein; that is, there may be a number of process steps before, in between and/or after the steps shown and described herein. Importantly, embodiments of the present invention can be implemented in conjunction with these other (perhaps conventional) processes and steps without significantly perturbing them. Generally speaking, the various embodiments of the present invention can replace portions of a conventional process without significantly affecting peripheral processes and steps.

Figure 1:
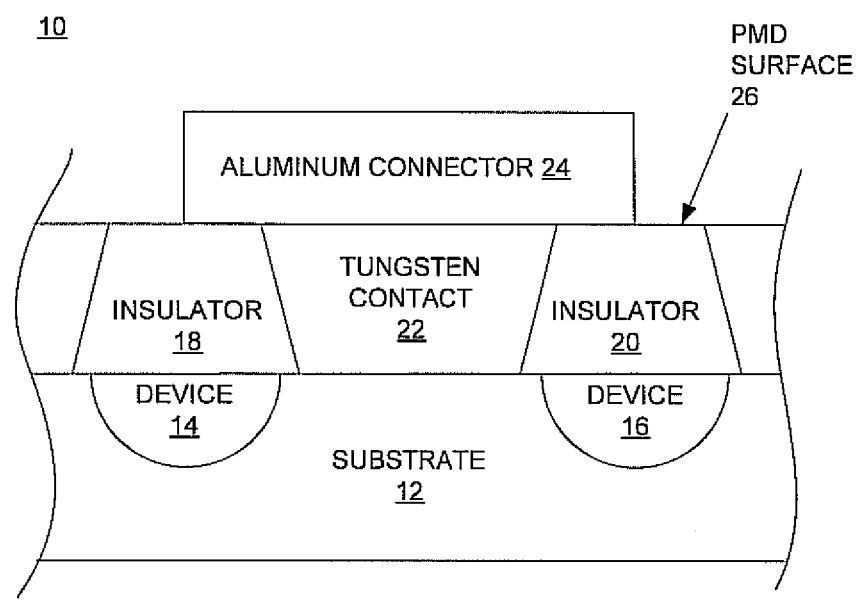
FIG. 1 is a sectional view showing selected layers of a structure according to one embodiment of the present invention.

FIG. 1 is a sectional view showing selected layers of a structure 10 according to one embodiment of the present invention. As mentioned above, structure 10 may include other devices, elements and layers beyond those illustrated and described.

In the example of FIG. 1, two devices 14 and 16 are formed within substrate 12. In one embodiment, substrate 12 is a silicon substrate.

Devices 14 and 16 are, in general, complementary metal oxide semiconductor (CMOS) devices. More specifically, in one embodiment, devices 14 and/or 16 are power metal oxide semiconductor field effect transistors (power MOSFETs). The details of devices 14 and 16 are not illustrated or described. Devices such as power MOSFETs are known in the art, and embodiments in accordance with the present invention can accommodate different varieties of power MOSFETs. In one embodiment, devices 14 and/or 16 are trench power MOSFETs.

In the example of FIG. 1, a contact 22 is positioned between device 14 and device 16, so that these devices can make electrical contact with each other or with other devices. Connector 24 in turn is in electrical contact with contact 22. In one embodiment, contact 22 is composed of tungsten, and connector 24 is composed of aluminum, although the present invention is not so limited.

In the present embodiment, insulators 18 and 20 are adjacent to devices 14 and 16, respectively. Insulators 18 and 20 may be composed of silicon dioxide or borophosphosilicate glass (BPSG), although the present invention is not so limited. The insulators 18 and 20 serve to isolate the devices 14 and 16, although either or both of the devices 14 and 16 are electrically coupled to contact 22. In other words, there is a specific conductive path from device 14 and/or from device 16 to contact 22.

With structure 10 oriented as in FIG. 1, the upper surface of contact 22 is essentially level with the pre-metal dielectric (PMD) surface 26. The upper surfaces of contact 22 and insulators 18 and 20 form a substantially flat surface. As will be seen from the discussion below, the substantially flat surface formed by contact 22 and insulators 18 and 20 facilitates the fabrication of smaller sized features, in particular smaller sized elements such as contact 22 and connector 24.

Figure 2:
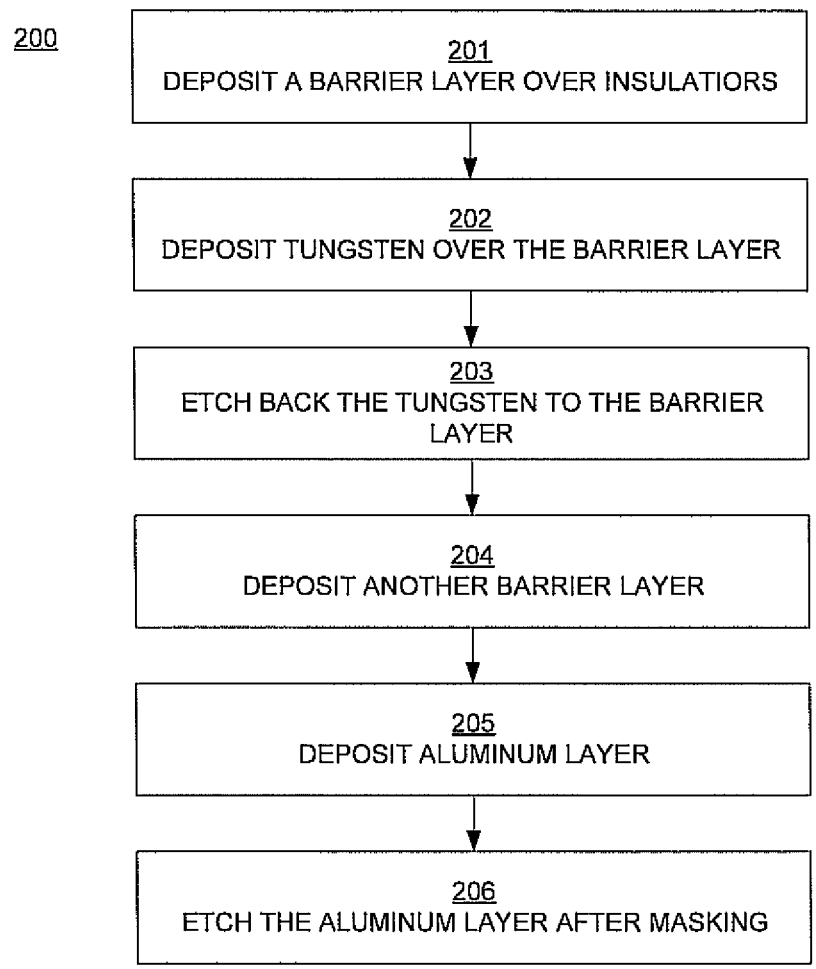
FIG. 2 is a flowchart of a process that is used in the fabrication of the structure of FIG. 1 according to one embodiment of the present invention.

FIG. 2 is a flowchart 200 of a process that is used in the fabrication of the structure 10 of FIG. 1 according to one embodiment of the present invention. Although specific steps are disclosed in FIG. 2, such steps are exemplary. That is, the present invention is well suited to performing various other steps or variations of the steps recited in FIG. 2. FIG. 2 is discussed in conjunction with FIGS. 3, 4 and 5, which are sectional views showing selected stages in the fabrication of the structure 10 of FIG. 1 according to an embodiment of the present invention.

Figure 3:
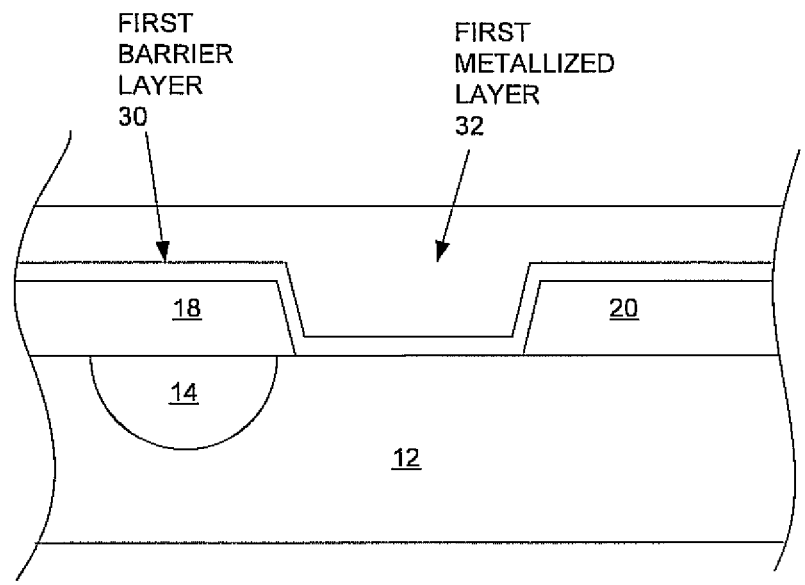
FIGS. 3, 4 and 5 are sectional views showing selected stages in the fabrication of the structure of FIG. 1 according to an embodiment of the present invention.

In block 201 of FIG. 2, with reference also to FIG. 3, a structure that includes device 14 is fabricated, or a structure so fabricated is received. In one embodiment, a first barrier layer 30 is deposited over the insulators 18 and 20 and over the area of substrate 12 between insulators 18 and 20. The area between insulators 18 and 20 is the contact area in which contact 22 of FIG. 1 will be formed. In one embodiment, the first barrier layer 30 is composed of titanium-nitride (TiN).

In block 202 of FIG. 2, with reference also to FIG. 3, a first metallized layer 32 is deposited over the first barrier layer 30. The first metallized layer 32 is deposited over the insulators 18 and 20 and in the contact area between insulators 18 and 20. In one embodiment, the first metallized layer 32 includes tungsten. Another material, such as copper, may instead be used. In one embodiment, the first metallized layer 32 is deposited using chemical vapor deposition (CVD).

Figure 4:
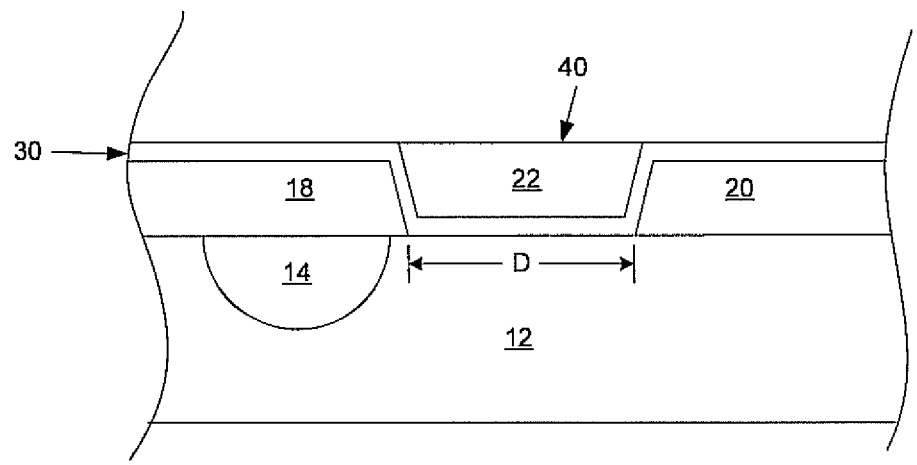

In block 203 of FIG. 2, with reference also to FIG. 4, the first metallized layer 32 is, in one embodiment, etched (planar etched) to the PMD surface 26 of FIG. 1. In other words, the first metallized layer 32 is etched back to the first barrier layer 30, so that the upper surface of the remaining portion of the first metallized layer 32 is essentially level with the upper surfaces of insulators 18 and 20. Thus, a substantially level surface 40 (which may correspond to the PMD surface 26) is formed across the insulators 18 and 20 and across the contact area between insulators 18 and 20.

The surface 40 so formed is level enough to improve focus during photolithography. That is, if a surface is too uneven, then parts of the surface may be in focus while other parts of the surface may be out of focus. However, in accordance with embodiments of the present invention, surface 40 is level enough to allow the parts of the surface that are of interest to remain in focus during photolithography. By improving focus across the surface, smaller sized features (e.g., connector 24 of FIG. 1) can be formed on the surface 40.

Furthermore, the width of the contact area (indicated as dimension D in FIG. 4) can be reduced. One advantage of reducing the contact area is that the density of devices (e.g., devices 14 and 16 of FIG. 1) can be increased. As the width D is reduced in size, materials such as aluminum may no longer be adequate for filling in the contact area, in order to form a proper contact. In accordance with embodiments of the present invention, CVD of the first metallized layer 32—in one embodiment, CVD of tungsten—is used to adequately fill smaller contact areas, forming a proper contact 22. In one embodiment, dimension D is in the range of approximately 0.35-0.50 microns.

Figure 5:
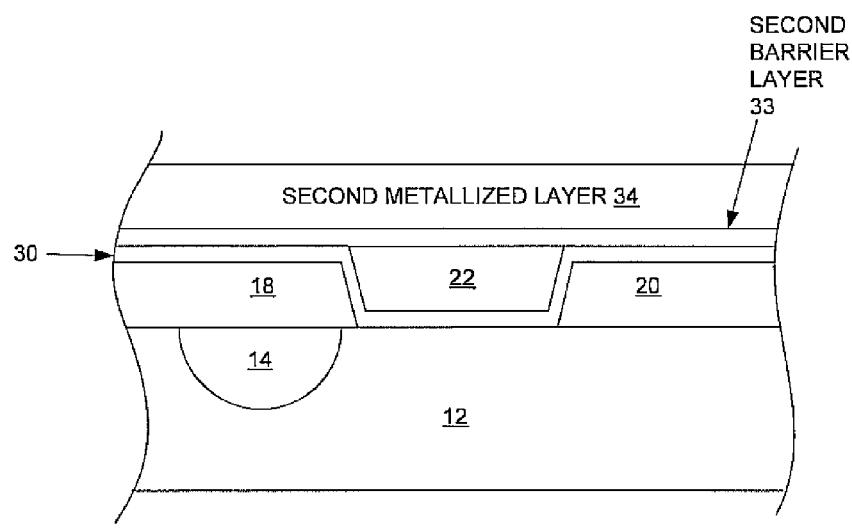

In block 204 of FIG. 2, with reference also to FIG. 5, in one embodiment, a second barrier layer 33 is deposited over the surface 40. In one embodiment, second barrier layer 33 is composed of titanium.

In block 205 of FIG. 2, with reference also to FIG. 5, a second metallized layer 34 is deposited over the second barrier layer 33. In one embodiment, the second metallized layer 34 includes aluminum.

In block 206 of FIG. 2, a mask (not shown) is used according to a photolithographic process to pattern the second metallized layer 34. The second metallized layer 34 is etched to form connector 24 of FIG. 1.

Figure 6:
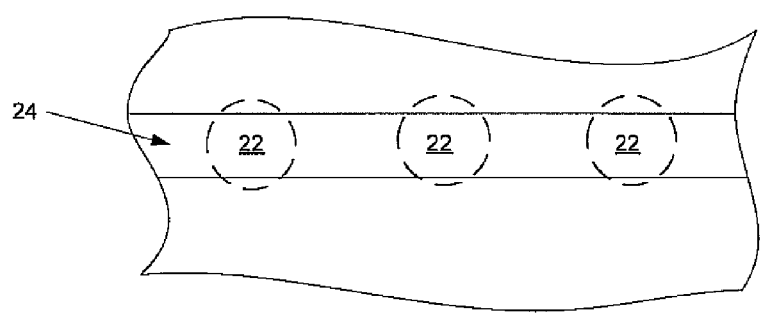
FIG. 6 is a top-down view of a portion of the structure of FIG. 1 according to one embodiment of the present invention.

FIG. 6 is a top-down view of the structure 10 of FIG. 1 according to one embodiment of the present invention. In the example of FIG. 6, connector 24 traverses a number of individual contacts 22 after the etch process of block 206 (FIG. 2). Although individual contacts 22 are illustrated in FIG. 6, embodiments in accordance with the present invention are not so limited. For example, embodiments in accordance with the present invention can also utilize continuous contacts (that is, as if the individual contacts 22 were joined to form a single contact).

Figure 7:
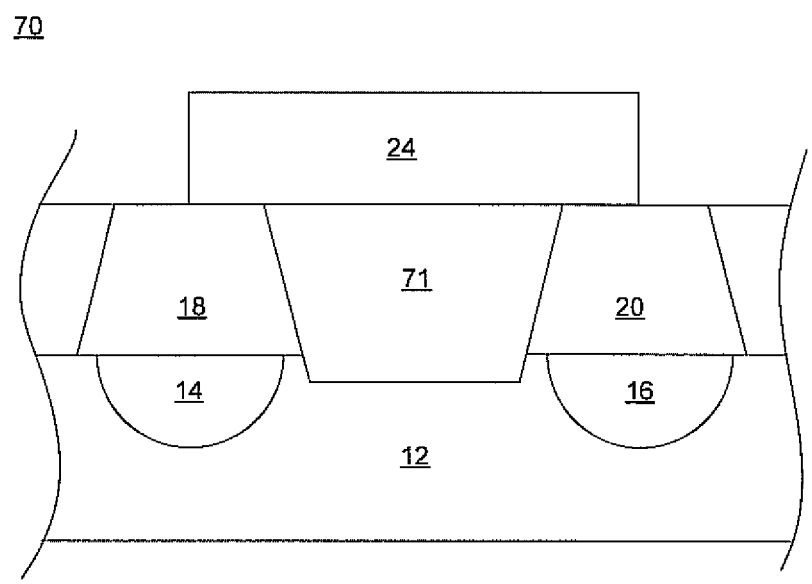
FIG. 7 is a sectional view showing selected layers of a structure according to another embodiment of the present invention.

FIG. 7 is a sectional view showing selected layers of a structure 70 according to another embodiment of the present invention. In contrast to the contact 22 of structure 10 of FIG. 1, which may be referred to as a planar contact, the contact 71 of FIG. 7 extends into the substrate 12. Contact 71 may be referred to as a trench contact. With structure 70 oriented as in FIG. 7, contact 71 extends below the upper surface 72 of substrate 12.

Contacts 71 and connector 24 of structure 70 can be formed using process 200 of FIG. 2. In block 201 of FIG. 2, with reference also to FIG. 3, a structure that includes device 14 and a trench adjacent to device 14 is fabricated, or a structure so fabricated is received. The remaining steps of process 200 are then performed as described above.

In summary, embodiments in accordance with the present invention facilitate the use of photolithography to fabricate semiconductor devices with smaller features. Smaller contacts can be formed by depositing a material such as tungsten into smaller contact areas. The resulting structure is etched to form a substantially even surface. The relative evenness of the surface improves focus and allows reduced size features to be formed on the surface.

Embodiments of the present invention are thus described. While the present invention has been described in particular embodiments, it should be appreciated that the present invention should not be construed as limited by such embodiments, but rather construed according to the below claims.

What is claimed is:

1. A structure comprising:
   an insulator having a second surface, wherein said second surface is in contact with a first surface of a substrate;
   an electrical contact coupled to said insulator;
   a first barrier layer deposited over and in contact with all surfaces of said insulator except for said second surface, wherein said first barrier layer is also deposited over and in contact with said substrate between said insulator and an adjacent insulator, wherein said first barrier layer is also deposited between and in contact with said electrical contact and said substrate, wherein a substantially even surface is formed by combining a surface of said first barrier layer and a surface of said electrical contact; and
   a semiconductor device formed in said substrate adjacent to and underneath said insulator and entirely isolated physically from said electrical contact and from said first barrier layer by said insulator, said semiconductor device electrically coupled to said electrical contact.

2. The structure of claim 1 wherein said semiconductor device comprises a power metal oxide semiconductor field effect transistor.

3. The structure of claim 1 wherein said electrical contact comprises tungsten.

4. The structure of claim 1 further comprising an electrical connector coupled to said electrical contact.

5. The structure of claim 1 wherein said electrical connector comprises aluminum.

6. The structure of claim 1 wherein said electrical contact has a width in the range of approximately 0.35-0.50 microns, said width measured in a direction parallel to said surface of said electrical contact.

7. A structure comprising:
   a semiconductor device formed in a substrate that has a first surface;
   an insulator having a second surface, wherein said second surface is in contact with said first surface;
   a first barrier layer deposited over and in contact with all surfaces of said insulator except for said second surface, wherein said first barrier layer is also deposited over and in contact with said substrate between said insulator and an adjacent insulator, wherein said first barrier layer is also deposited between and in contact with said electrical contact and said substrate, wherein a substantially even surface is formed by combining a surface of said first barrier layer and a surface of said electrical contact;
   an electrical contact electrically coupled to said semiconductor device, wherein said electrical contact comprises tungsten;
   a second barrier layer deposited over and in contact with said substantially even surface and extending across and above both said insulator and said electrical contact; and
   an electrical connector coupled to said electrical contact, wherein said electrical connector comprises aluminum.

8. The structure of claim 7 wherein said semiconductor device comprises a power metal oxide semiconductor field effect transistor.

9. The structure of claim 7 wherein said electrical contact has a width in the range of approximately 0.35-0.50 microns, said width measured in a direction parallel to said substrate.

10. The structure of claim 7 wherein said electrical contact is a planar contact that does not extend into said substrate.

11. The structure of claim 7 wherein said electrical contact is a trench contact that extends into said substrate.

* * * * *